(12) United States Patent
Hoefer et al.

(10) Patent No.: US 6,544,309 B1
(45) Date of Patent: Apr. 8, 2003

(54) DEVICE FOR COOLING AN ELECTRIC MODULE AND A TECHNICAL APPLIANCE

(75) Inventors: Bruno Hoefer, Olching (DE); Guido Reeck, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/958,899

(22) PCT Filed: Apr. 12, 2000

(86) PCT No.: PCT/DE00/01140

§ 371 (c)(1),
(2), (4) Date: Oct. 12, 2001

(87) PCT Pub. No.: WO00/62589

PCT Pub. Date: Oct. 19, 2000

(30) Foreign Application Priority Data

Apr. 13, 1999 (DE) .......................................... 199 16 595

(51) Int. Cl.⁷ .......................... B01D 29/70; B01D 29/72
(52) U.S. Cl. ........................... 55/283; 55/292; 55/304; 55/385.6; 55/467; 96/421; 96/422; 361/695
(58) Field of Search ...................... 55/467, 472, 522, 55/300, 283, 292, 293, 304, 285.2, 385.6; 96/188, 189, 421, 422; 361/695

(56) References Cited

U.S. PATENT DOCUMENTS

| | | | | |
|---|---|---|---|---|
| 5,349,844 A | * | 9/1994 | Lilienfeld | .................. 73/28.01 |
| 5,566,377 A | | 10/1996 | Lee | |
| 5,886,296 A | | 3/1999 | Ghorbani et al. | |
| 5,888,134 A | * | 3/1999 | McNair, Jr. | .................. 454/184 |
| 5,928,414 A | * | 7/1999 | Wnenchak et al. | ........... 95/280 |

FOREIGN PATENT DOCUMENTS

| | | |
|---|---|---|
| DE | 34 13 213 A1 | 10/1985 |
| DE | 196 26 778 A1 | 1/1998 |
| DE | 197 55 944 A1 | 8/1999 |
| EP | 0 804 966 A1 | 11/1997 |

* cited by examiner

*Primary Examiner*—Robert A. Hopkins
(74) *Attorney, Agent, or Firm*—Bell Boyd & Lloyd LLC

(57) ABSTRACT

An apparatus having at least one membrane filter for a superficial filtering of at least dirt particles from inflowing cooling air for cooling an electrical module and also at least one cooling device for establishing an air flow in the housing and for discharging the heated-up cooling air out of the housing from at least one air outlet, the membrane filter associated with a vibration generator to undergo a mechanical vibration which causes the dirt particles deposited on the surface to be dislodged.

12 Claims, 4 Drawing Sheets

Side view

Front view

DEVICE FOR COOLING AN ELECTRIC MODULE AND A TECHNICAL APPLIANCE

BACKGROUND OF THE INVENTION

The present invention relates to an apparatus for cooling an electrical module arranged in a housing and, in particular, a base station of a mobile radio system or wireless subscriber line system.

In an electrically operated technical appliance, the lost power of components and modules through which current flows leads to a heating-up of the appliance. Since standard electrical components for technical appliances have only a limited admissible operating temperature range of, for example, up to 70° C., they are cooled by cooling devices. These cooling devices are, for example, fans which establish an air flow in the housing, flowing around or through the electrical components and modules, and which consequently bring about a discharge of the thermal output produced.

During operation of the technical appliances outside enclosed spaces or in adverse conditions within enclosed spaces, adequate protection from environmental influences, such as, for example, dirt particles and liquids, must be additionally provided along with heat discharge. In this respect, protective regulations in accordance with the specified IP classes must be observed in order to ensure long-term functioning of the technical appliances.

It is known from DE 19755944 to provide in an air inlet of a housing a membrane filter for a superficial filtering of dirt particles from inflowing cooling air and for separating out liquids. In comparison with a housing known, for example, from DE 19626778, with an air/air heat exchanger, which ensures complete separation of an internal cooling circuit from an external cooling circuit, adequate protection of the electrical modules can be achieved for the aforementioned areas of use of the technical appliance with the corresponding protective regulations in a simple way by use of the membrane filter. At the same time, a temperature difference, required for the cooling, between the temperature of the ambient atmosphere and the temperature inside the housing is reduced.

A membrane filter of this type is based, for example, on a membrane known for use in articles of clothing by the designation Goretex, Sympatex, etc. This membrane includes a fine netting or knitted fabric of fibers, which permits a very small pore size. An example of a material which may be used for this is PTFE (polytetrafluoroethylene), also known by the name Teflon. The membrane is generally provided on a backing material, such as, for example, polyamide, in order to achieve a certain stability and resistance of the membrane filter.

The very small pore size of the membrane filter makes it more resistant to soiling in comparison with conventional filters, since, for example, dirt particles cannot become lodged in the knitted fabric of the membrane and are deposited on the surface of the filter. In spite of this property, dirt particles are deposited on the surface of the membrane filter and form what is known as a filter cake, which for the cooling air represents a resistance additionally to be overcome. This filter cake may have disadvantages with regard to minimizing the cooling air throughput due to the increased counterpressure with the resultant effect that the admissible temperature limit is exceeded.

The present invention is, therefore, directed toward specifying an arrangement for cooling an electrical module and a technical appliance which permits simple cleaning of the membrane filter.

SUMMARY OF THE INVENTION

The apparatus according to the present invention for cooling an electrical module arranged in a housing has at least one membrane filter, arranged in an air inlet of the housing in each case, for at least a superficial filtering of dirt particles from inflowing cooling air for cooling the electrical module and also at least one cooling device for establishing an air flow in the housing and for discharging the filtered cooling air, heated up from flowing through and/or around the module, out of the housing from at least one air outlet. The membrane filter is characterized by being associated with at least one vibration generator to undergo a mechanical vibration which causes the dirt particles deposited on the surface of the membrane filter to be dislodged.

The configuration of the apparatus according to the present invention has the advantage that the membrane filter is freed of the dirt particles deposited on the surface in a simple way by the mechanical vibration generated, in which the filter cake is virtually shaken off.

According to a first embodiment of the present invention, the membrane filter additionally separates out liquids at the surface, whereby use of the associated technical appliance is also possible outside enclosed spaces or under adverse ambient conditions.

According to a further embodiment of the present invention, the generated magnetic vibration has a frequency which corresponds to a natural resonant frequency of the membrane filter. This frequency brings about a mechanical movement of the membrane filter with a greatest possible amplitude, whereby more effective cleaning of the membrane filter is advantageously achieved.

According to four additional alternative embodiments, the vibration generator may be provided in the form of an electrodynamic transducer, an electromagnetic transducer, an electromechanical transducer or an electrostatic transducer.

In the case of the first three additional alternative embodiments, the membrane filter is mechanically coupled to an electromechanical, electromagnetic transducer, which generates mechanical vibrations. In this case, it is also possible, for example, for a frame in which the membrane filter is fastened to be made to undergo a mechanical vibration, it having to be ensured in any event that dirt particles or liquid cannot penetrate into the housing; for example, due to gaps or openings being produced by the vibration.

According to one embodiment, the electromechanical transducer may, for example, be provided in the form of a piezoelectric transducer.

In the case of the fourth additional alternative embodiment, the membrane filter is arranged between two capacitor plates, an electrostatic force between the capacitor plates bringing about the mechanical movement of the membrane filter. In this case, the membrane filter must be made entirely or partially from an electrically conductive material.

According to a development of the fourth additional alternative embodiment, the capacitor plates are provided in the form of an electrically conductive netting. This netting advantageously does not cause any restriction of the cooling air throughput and can be used both for electromagnetic shielding and for additional protection of the membrane filter from environmental influences.

According to a development referring back to the preceding embodiments, the membrane filter is made from an electrically conductive material as a capacitor plate, having the advantageous result of simplifying the mechanical construction.

According to a further embodiment of the present invention, a control device controls the vibration generator for the cleaning of the membrane filter periodically and/or on the basis of a degree of soiling of the membrane filter. The control device controls the vibration generator, for example, on the basis of a necessary rotational speed of the cooling device designed as a fan. In this case, the required cooling air throughput can be determined while taking into account the temperature difference between the outside atmosphere and the interior of the housing. If an increase in the speed of the fan by a certain factor is necessary to achieve the same cooling air throughput, or if the cooling air throughput at a constant speed of the fan falls below a certain threshold value, a certain degree of soiling of the membrane filter can be concluded and a cleaning operation initiated by the control device. Furthermore, a cleaning operation may be initiated by a pressure measurement in the interior of the housing; for example, under the control of a differential pressure switch. This involves permanently or periodically measuring the pressure in the housing and comparing it with a threshold value. If the measured pressure falls below this threshold value, the cleaning operation is initiated by the control device. In addition to these dynamic activations of the cleaning operation, the cleaning operation also may be performed periodically; for example, under the control of a timer in the control device. The cleaning of the membrane filter can, consequently, be freed of deposited dirt particles in a simple way outside the normal maintenance intervals of the technical appliance.

Furthermore, the control device may control, for example, the frequency of the vibration generated in the vibration generator.

The apparatus according to the present invention can be used in technical appliances with at least one electrical module, such as, for example, base stations of a mobile radio system or wireless subscriber line system (access network systems), traffic control devices, power supply devices or switch cabinets for a control system of industrial machines. In the same way, the apparatus according to the present invention can be used, for example, in smaller electrical appliances, such as, for example, a portable or stationary home computer, or in electrical measuring instruments.

Additional features and advantages of the present invention are described in, and will be apparent from, the following Detailed Description of the Invention and the Figures.

DETAILED DESCRIPTION OF THE INVENTION

Figure 1:
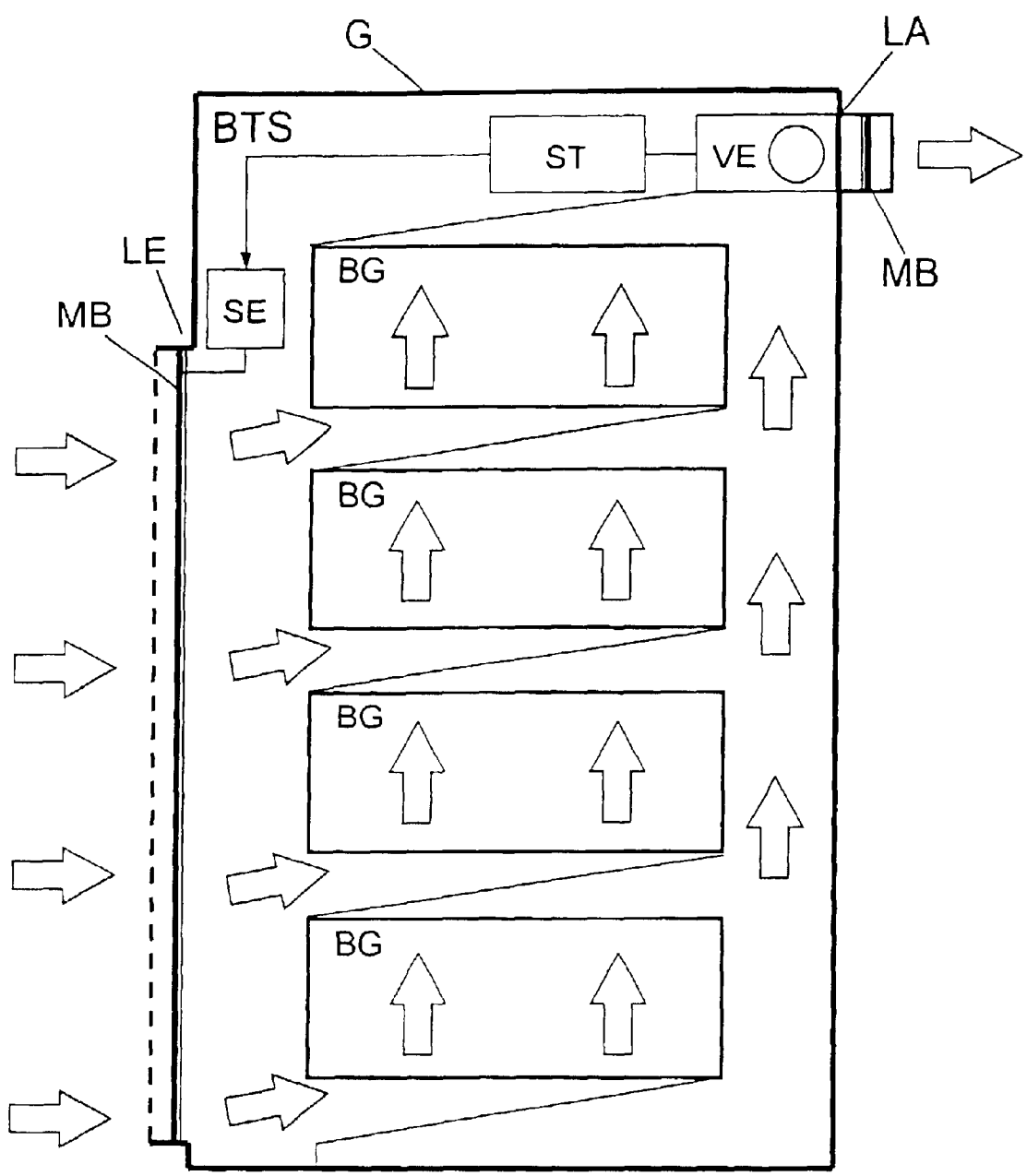
FIG. 1 shows a base station of a mobile radio system with the apparatus according to the present invention for cooling electrical modules, in a side view.

A prior-art technical appliance, such as, for example, a base station BTS of a mobile radio system or wireless subscriber line system, according to FIG. 1, includes one or more electrical modules BG. During the operation of the electrical appliance, the lost power of the individual electrical modules BG results in a heating-up effect, giving rise to the necessity for cooling in order not to exceed a maximum admissible operating temperature of the modules BG or individual electrical components.

The housing G, represented in a side view, of an electrical appliance has on one end face an air inlet LE with a membrane filter MB. The overall dimensions of the air inlet LE are set, for example, in such a way that cooling air flowing in through the membrane filter MB from the ambient atmosphere of the technical appliance can flow through the electrical modules BG in each case from below and, if appropriate, from the front. Consequently, it brings about a cooling-down of the modules BG or electrical components on the modules BG. The active surface area of the membrane filter MB, which may be larger than the air inlet LE, for example due to a fold formation, is dimensioned such that the pressure drop of the inflowing cooling air can be compensated by a cooling device VE, or an adequate amount of cooling air can still flow in despite a partial clogging of the membrane filter MB by dirt particles or liquid. To satisfy regulations with regard to the electromagnetic compatibility, arranged in front of the membrane filter MB is, for example, a wire netting which is electrically connected to the housing G of the technical appliance. This wire netting may at the same time also represent mechanical protection of the membrane filter MB from environmental influences.

Arranging the modules BG in such a way that they are spaced apart from one another makes it possible for a flow to take place through and/or around the modules BG. According to a known type of design, the modules BG include, for example, a module frame with electronic components and high-performance circuits located therein. The module frames are provided with ventilation slits, through which cooling air can reach the components and circuits. Within the scope of the present invention, modules BG are understood as also meaning all the electrical devices of a technical appliance. These are to include, for example, printed-circuit boards provided in a personal computer and also peripheral units, such as, for example, hard disks.

The apparatus of FIG. 1 has, in the spaces between the individual modules BG and also below the lowermost and above the uppermost module BG, air-directing devices which have the task of distributing cooling air flowing in through the membrane filter MB evenly over the base area of the respective module BG, so that a homogeneous flow through the entire module BG occurs. Furthermore, the air-directing devices may be used for the mutual electromagnetic shielding of the modules BG with regard to satisfying the EMC regulations.

The membrane filter MB is arranged, for example, in a frame which permits rapid removal of the membrane filter unit cartridge, including the membrane filter and the frame, for maintenance and cleaning purposes or for replacement. At the same time, the frame permits a described folding of the membrane filter MB. To restrict the overall dimensions of the technical appliance, the frame also may be integrated into the housing G.

The membrane filter MB is designed in the form of a surface filter, which has the especially advantageous property of separating out dirt particles and liquids from the ambient atmosphere already at the surface of the membrane, whereby, for example, sensitive electronic components or circuits in the modules BG are protected from environmental influences of this type. A membrane filter MB of this type is based, for example, on a membrane known by the designation Goretex, Sympatex, etc., for use in articles of clothing. The membrane of the filter includes a fine netting or a knitted fabric of fibers. A very small pore size prevents any ingress of the dirt particles and consequently irreversible clogging of the membrane. Nevertheless, dirt particles can be deposited on the surface of the membrane to form what is known as a filter cake, but this can be removed in a simple way by the apparatus according to the present invention. In the same way, liquids cannot pass the membrane up to a specific pressure per unit area. An example of a material used for the membrane is PTFE, also known by the name Teflon. The membrane is generally applied to a coarsely woven backing material, such as, for example, polyamide, in order to achieve high stability and resistance of the membrane filter MB.

A special design of the membrane filter MB allows protective regulations in accordance with the IP guidelines up to, for example, IP55 to be satisfied, thereby permitting use of the technical appliance outside enclosed spaces or under adverse ambient conditions, such as occur, for example, in industrial production. Special selection of the membrane filter material additionally allows individual adaptation to the actual ambient conditions, such as, for example, resistance to acids.

The cooling of the electrical modules BG by a direct flow of cooling air through the housing G has the advantage of a necessary temperature difference tending toward zero between the temperature of the ambient atmosphere or the temperature of the inflowing cooling air and the temperature inside the housing G. As such, the operation of the electrical modules BG is safeguarded even at a temperature of the ambient atmosphere of, for example, +70° C., which corresponds to the limiting temperature of the components, reduced by the degree of internal heating-up.

A cooling device VE, which is arranged, for example, in the upper region of the rear housing wall, sucks in the air heated up as it flows through or around the electrical modules BG and discharges it to the ambient atmosphere through an air outlet LA. Used as cooling devices VE are, for example, one or more fans which produce an air flow. Cooling via natural convection is not adequate for reliable operation of the modules BG below the limiting temperature if a strong heating-up of the modules BG occurs due to a high internal lost power. The air outlet LA likewise may be protected by a membrane filter MB from ingress of liquids and dirt particles.

To control the temperature inside the housing G, the speed of the fan is automatically controlled by a control device ST. To acquire parameters for this control, temperature sensors which permanently determine the temperatures of the inflowing cooling air and the atmosphere inside the housing G or the temperature of special components may be provided, for example, in the region of the air inlet LE, the air outlet LA and also at various points inside the housing G, the temperatures being evaluated by the control device ST. In this automatic control, the throughput of the cooling air in the housing G is changed via the speed of the fan of the cooling device VE in order to obtain, for example, a constant temperature inside the housing G independently of the temperature of the ambient atmosphere. A constant operating temperature of the modules BG has positive effects; for example, on the service life of electrical components and high-performance circuits. In addition, constantly keeping the speed of the cooling device VE low, on condition that the limiting temperature of the components is not exceeded, makes it possible to minimize the noise emission of the technical appliance. Furthermore, the automatic control makes it possible to dispense with the operation of the cooling device VE initially during cold starting of the appliance, to allow the modules BG to heat up quickly to the desired operating temperature, and to carry out further automatic control of the cooling device VE only once this operating temperature has been reached to maintain the constant operating temperature.

The cooling air permanently flowing in through the membrane filter MB during the operation of the technical appliance causes dirt particles to be deposited on the surface of the membrane filter MB and they may lead to a restriction of the cooling air throughput. Due to the special properties of the membrane filter MB, as described, the dirt particles are deposited on the surface of the filter. The fact that the dirt particles cannot penetrate into the filter and become lodged allows the latter to be freed of the dirt particles deposited on the surface in a simple way by the arrangements according to the present invention described below.

A cleaning operation on the membrane filter MB may be initiated, for example, by a permanent measuring process of the air throughput in dependence on the speed of the cooling arrangement VE, when it falls below a fixed value; the measured ratio indicating the degree of soiling of the membrane filter MB. The air throughput is, for example, evaluated by an air-throughput measuring device arranged in the air outlet LA and evaluated by the control device ST. A further possibility is a permanent or periodic pressure measurement in the housing, for example by a differential pressure switch, which compares a pressure determined at the time with a predetermined threshold value and, if the pressure falls below this threshold value, sends a signal to the control device. If there is a certain restriction of the cooling air throughput through the membrane filter MB, the cooling device VE, for example, delivers a large amount of cooling air from the housing G than can flow into the housing G through the air inlet LE, whereby negative pressure is produced in the housing G. After evaluation of this signal, the control device ST initiates the cleaning operation. In the same way, the cleaning operation may be initiated by the control device ST, for example under the control of a timer, at periodic time intervals.

After the evaluation of the stated parameters or after the elapse of a predetermined time interval, the control device ST activates a vibration generator SE, which makes the membrane filter MB undergo a mechanical vibration in the way according to the present invention. The mechanical movement of the membrane filter MB causes the deposited filter cake to be broken up and detached, whereby a cleaning effect is achieved. This automatic cleaning operation has the advantage over cleaning of the membrane filter MB, for example, in the course of maintenance of the technical appliance that, on the one hand, the maintenance intervals can be extended and, on the other hand, the operating costs of the technical appliance can be reduced due to an optimum mode of operation of both the cooling device VE and the modules BG.

According to the present invention, the vibration generator SE may be provided in the form of number of alternative transducer devices. In FIG. 1, the vibration generator SE is, for example, an electromagnetic, electrodynamic or electromechanical transducer, which is, in each case, mechanically coupled to the membrane filter MB or to a frame in which the membrane filter MB is arranged.

The electromagnetic transducer may be designed, for example, as a known electric motor, on the rotating shaft of which an eccentric disk brings about a movement of a push rod connected to the membrane filter MB or its frame.

Furthermore, the electromagnetic transducer designed as a known electromagnet can cause a soft-iron membrane, for example of thin sheet steel, to vibrate when an AC voltage is applied by a magnetic field of a coil which is mechanically connected to the membrane filter or its frame.

The electromechanical transducer is designed, for example, as a piezoelectric transducer. A piezoelectric transducer is based on the principle that a piezoelectric crystal, such as quartz, is induced to vibrate by applying an AC voltage. This vibration can be transferred to the membrane filter MB or its frame through a mechanical coupling. Piezoelectric transducers in the form of flat disks are known for example. When an AC voltage is applied, the disk undergoes a mechanical vibration of the same frequency, the amplitude and alignment of which are determined by the mechanical properties—size, shape, prestress and mounting. To achieve great mechanical movements, the piezo disk must be suitably dimensioned and shaped and/or be provided with a mechanical construction for amplitude gain or amplitude transformation.

A further possibility for cleaning the membrane filter MB is the use of an electrodynamic transducer. It is based on a movement of a coil which is in a permanent magnetic field and through which an alternating current flows. The coil moves in proportion to an applied AC voltage, since the AC voltage produces a magnetic force field in the coil, acting together with the permanent magnet to produce a movement. If the coil is mechanically coupled to a membrane, the membrane is made to undergo vibration.

Figure 2:
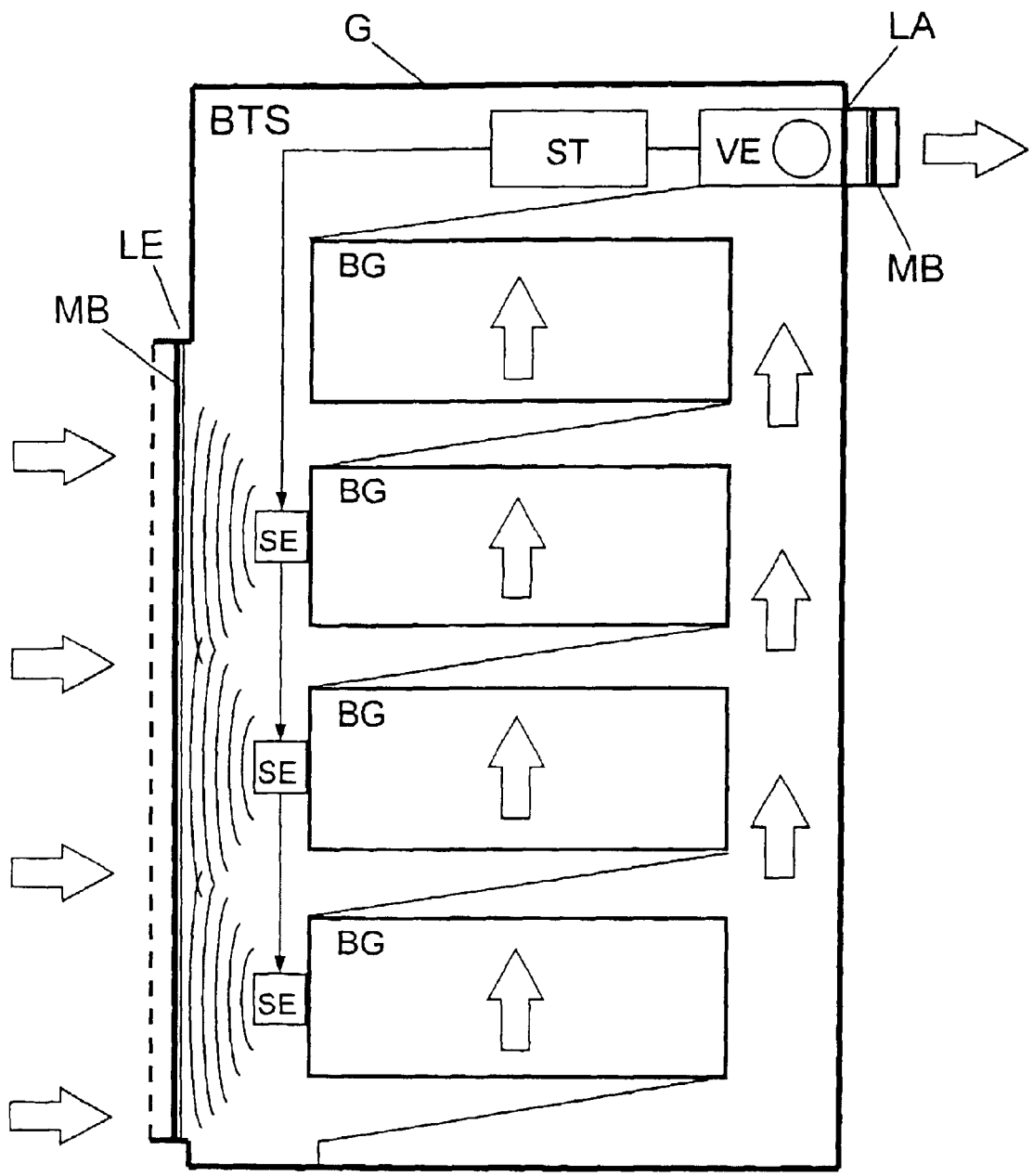
FIG. 2 shows the apparatus according to the present invention with the membrane filter being subjected to pressure waves.

The transducers described alternatively can be used, as represented in FIG. 2, for generating pressure waves; to which the membrane filter MB is subjected—the mechanical coupling in this case takes place via the air. One or more transducers are arranged inside the housing G on the rear side of the membrane filter MB, the arrangement advantageously being such that the entire surface area of the membrane filter MB is subjected to the pressure waves. The pressure waves bring about a periodic pushing and pulling phase in the direction of vibration.

Figure 3:
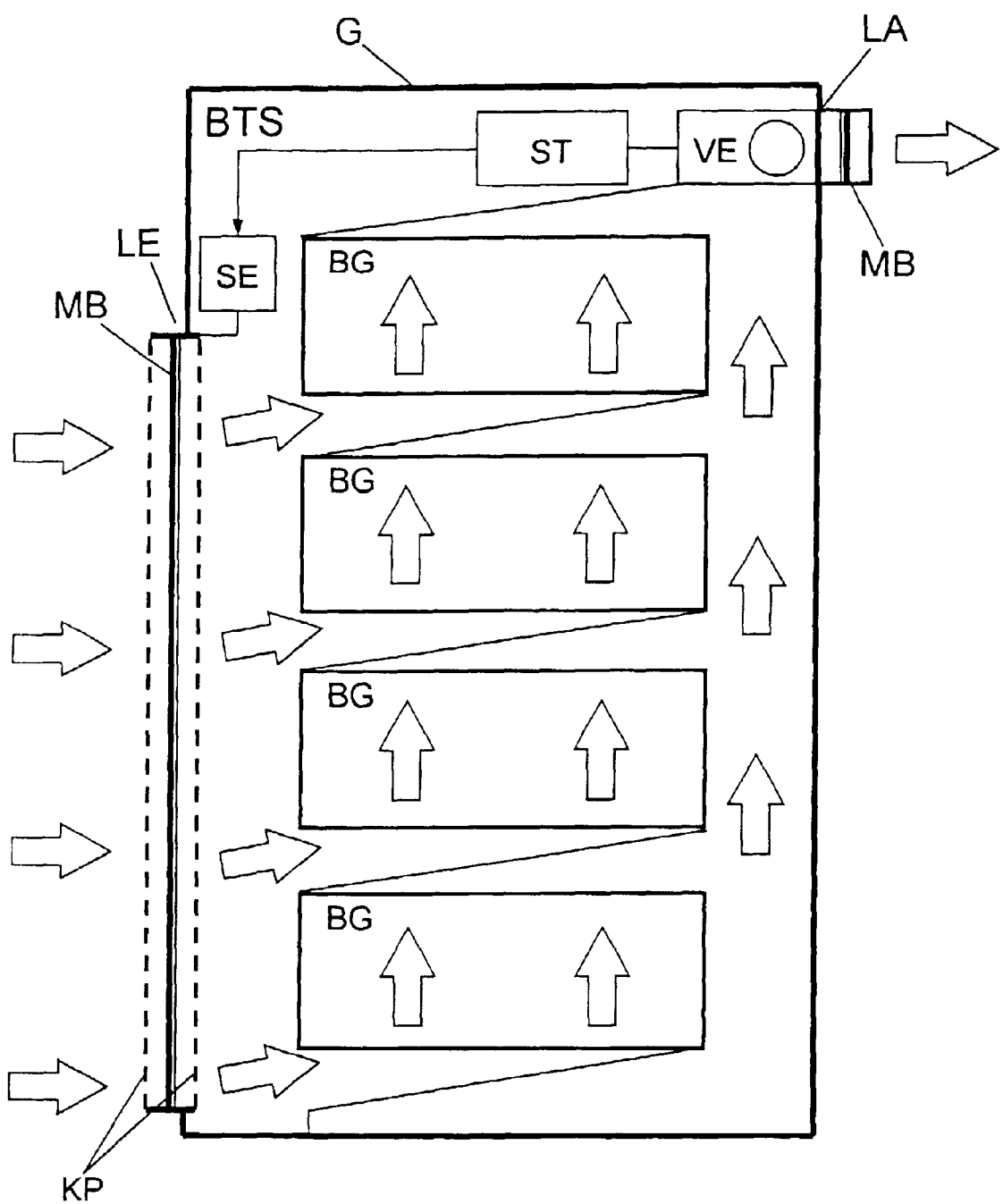
FIG. 3 shows the apparatus according to the present invention with an electrostatic transducer, in a side view.
Figure 4:
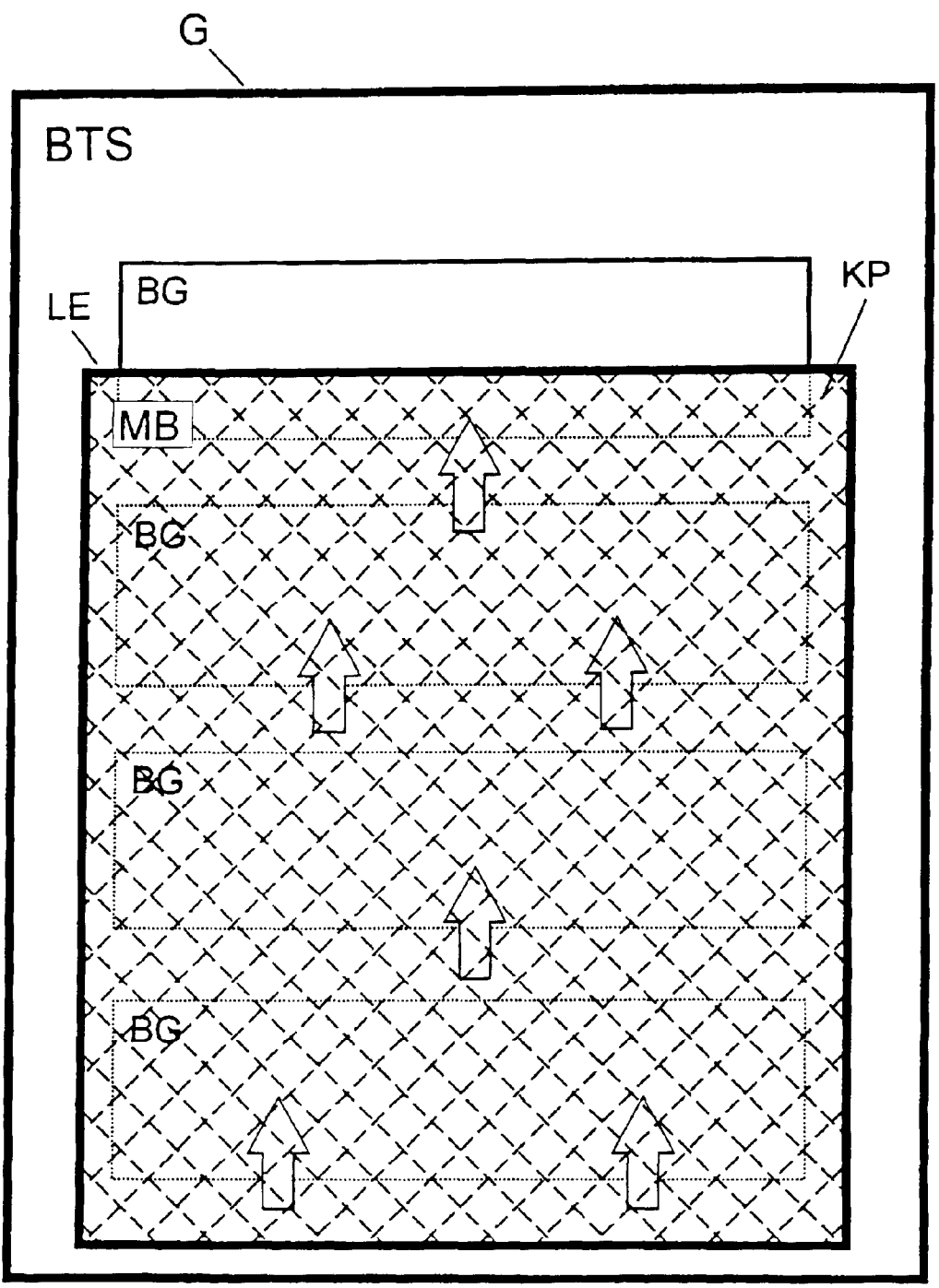
FIG. 4 shows a front view of the apparatus according to the present invention of FIGS. 1 through 3.

A further solution according to the present invention, in which an electrostatic transducer is used for generating a mechanical movement of the membrane filter MB or its frame, is represented in FIG. 3. The electrostatic transducer is based on the capacitor principle, in which the force effect of an electrical field between two capacitor plates KP is used to make an electrically conductive membrane vibrate. In FIGS. 3 and 4, the two capacitor plates KP are respectively provided, by way of example, in the form of a netting of an electrically conductive material, such as copper or aluminum, and are arranged at a distance from the membrane filter MB. A sheet-steel plate, for example a perforated sheet-steel plate, may be used in the same way. As clearly illustrated in FIG. 4, the nettings do not cause any restriction of the air throughput and can be used advantageously as mechanical protection of the membrane filter MB. The capacitor plates KP can be used during the normal operation of the technical appliance for electromagnetic shielding, being connected, for example, through the vibration generator SE to ground or to the housing G. For the cleaning operation, the capacitor plates KP are disconnected from ground and the vibration generator SE applies a voltage to the capacitor plates KP which generates an alternating electrical field between the capacitor plates KP and induces the membrane filter MB to undergo vibration.

As an alternative to this, according to a modification not represented, the electrostatic transducer may be provided in such a form that the membrane filter MB consists entirely or partially of an electrically conductive material and is used as a capacitor plate KP. The opposite rigid capacitor plate KP is, for example, again the netting for the electromagnetic shielding. By changing the charging of the movable capacitor plate KP or of the membrane filter MB, a vibration of the capacitor plate KP is achieved.

In all the cases described, a vibration with the resonant frequency of the membrane filter MB is advantageously generated, since this induces the greatest possible movement of the membrane filter MB and consequently intensifies the cleaning operation. If the membrane filter MB is subjected to pressure waves, a certain phase shift between the individual sources also may be chosen, for example, so that the surface of the membrane filter MB is made to undergo an undulating movement and more rapid loosening of the dirt particles is achieved as a result.

Although the present invention has been described with reference to specific embodiments, those of skill in the art will recognize that changes may be made thereto without departing from the spirit and scope of the invention as set forth in the hereafter appended claims.

What is claimed is:

1. An apparatus for cooling an electrical module, comprising:
   a housing, wherein the electrical module is positioned inside the housing;
   at least one membrane filter positioned in an air inlet of the housing, the membrane filter providing filtering of at least dirt particles from inflowing air for cooling the electrical module;
   at least one vibration generator associated with the at least one membrane filter, the at least one vibration generator causing the at least one membrane filter to undergo a mechanical vibration to cause the dirt particles deposited on a surface of the at least one membrane filter to be dislodged; and
   at least one cooling device for establishing an air flow in the housing and for discharging filtered cooling air, which is heated up upon flowing through and around the electrical module, out of at least one air outlet of the housing.

2. An apparatus for cooling an electrical module as claimed in claim 1, wherein the membrane filter separates out liquids at the surface.

3. An apparatus for cooling an electrical module as claimed in claim 1, wherein the mechanical vibration has a frequency which corresponds to a natural resonant frequency of the membrane filter.

4. An apparatus for cooling an electrical module as claimed in claim 1, wherein the vibration generator is an electrodynamic transducer which is mechanically connected to the membrane filter.

5. An apparatus for cooling an electrical module as claimed in claim 1, wherein the vibration generator is an electromagnetic transducer mechanically connected to the membrane filter.

6. An apparatus for cooling an electrical module as claimed in claim 1, wherein the vibration generator is an electromechanical transducer mechanically connected to the membrane filter.

7. An apparatus for cooling an electrical module as claimed in claim 6, wherein the electromechanical transducer is a piezoelectric transducer.

8. An apparatus for cooling an electrical module as claimed in claim 1, further comprising:

two capacitor plates, wherein the vibration generator is an electrostatic transducer and the membrane filter is formed of an electrically conductive material positioned between the two capacitor plates, an electrostatic force between the two capacitor plates effecting the mechanical vibration of the membrane filter.

9. An apparatus for cooling an electrical module as claimed in claim 8, wherein the two capacitor plates are respectively formed of a netting of an electrically conductive material.

10. An apparatus for cooling an electrical module as claimed in claim 1, wherein the vibration generator is an electrostatic transducer, the membrane filter is formed from an electrically conductive material as one of two capacitor plates, and an electrostatic force between the two capacitor plates effects the mechanical vibration of the membrane filter.

11. An apparatus for cooling an electrical module as claimed in claim 1, further comprising:

a control device for activating the vibration generator, the activation occurring on a basis which is at least one of periodic and determined by a degree of soiling of the membrane filter.

12. An apparatus for cooling an electrical module as claimed in claim 1, wherein the apparatus is incorporated into a base station of at least one of a mobile radio system and a wireless subscriber line system.

* * * * *